United States Patent [19]

Lemelson

[11] Patent Number: 5,132,587
[45] Date of Patent: Jul. 21, 1992

[54] SPARK PLUG ELECTRODES

[76] Inventor: Jerome H. Lemelson, 48 Parkside Dr., Princeton, N.J. 08540

[21] Appl. No.: 494,690

[22] Filed: Mar. 16, 1990

Related U.S. Application Data

[63] Continuation-in-part of Ser. No. 32,352, Mar. 31, 1987, Pat. No. 4,960,643.

[51] Int. Cl.$^5$ .................. H01T 13/20; H01J 1/02
[52] U.S. Cl. .................. 313/141; 313/311; 313/355
[58] Field of Search .................. 313/141, 355, 311; 501/86

[56] References Cited

U.S. PATENT DOCUMENTS 3,673,452  6/1972  Brennen .................. 313/141
4,164,680  8/1979  Villalobos .................. 313/311 X

*Primary Examiner*—Palmer C. DeMeo

[57] ABSTRACT

New and improved structures in electrodes employed in electrical discharge machinery and the like. In one form, electrodes of a spark plug, such as the side and center electrodes thereof, are entirely coated with a thin layer of synthetic diamond material deposited in situ therein as carbon atoms, carbon atoms containing gas or vapor through which microwave energy is beamed against the surfaces receiving such deposited material which forms a synthetic diamond layer. In another form, select portions of the side and center electrodes of a spark plug, such as the end portions thereof subjected to arcing when sparks are generated therebetween, are coated with thin layers of synthetic diamond or diamond-like material to improve their resistance to heat corrosion and pitting caused by the sparks discharged therebetween and the heat of combustion resulting therefrom. In another form, other types of electrodes, such as high voltage electrodes employed in high voltage equipment, are similarly coated and protected against heat, chemical and electrical degradation and erosion.

13 Claims, 1 Drawing Sheet

SPARK PLUG ELECTRODES

RELATED APPLICATIONS

This is a continuation-in-part of application Ser. No. 032,352 filed Mar. 31, 1987 now U.S. Pat. No. 4,960,643.

SUMMARY OF THE INVENTION

This invention relates to new and improved structures in electrodes for use in electrical equipment, internal combustion engines, electric lamps and the like, which are normally subject to heat, corrosion and, in certain instances, to chemical corrosion caused by a chemical process, such as combustion or other process which generally takes place at high temperature caused either by an electrical discharge and/or by combustion of a fuel. In a particular form of the invention, all or select portions of the side and center electrodes of a spark plug are coated with a thin film of synthetic diamond material deposited in situ thereon and operable to protect the electrodes from pitting or electrical discharge erosion and/or chemical corrosion effected at high temperature during the combustion process. Other forms of the invention include the application of such a synthetic diamond material to electrodes and filaments of light emitting devices such as incandescent lamps, glow discharge lamps and the like. In certain instances, to further protect the filaments or electrodes from erosion and corrosive effects during use, an overcoating of a thin layer of chromium is applied directly against the outer surface of the synthetic diamond film coating the electrodes or filaments.

In a preferred form of the invention, the diamond film is formed in situ on the electrode to a depth of less than 0.001" whereby it will protect the surface of the electrode which is normally subject to spark or plasma generated erosion during discharge of electrical energy from the electrode to a cathode or opposed electrode such as employed in electron beam discharge devices, incandescent lamps and the like and spark plugs. In certain applications involving high voltage and current, the synthetic diamond coatings may be applied in coating thicknesses greater than 0.001", though in most coating thicknesses in the range of 0.0001" to 0.001" will suffice.

Accordingly it is a primary object of this invention to provide a new and improved structure in an electrode for an electrical device.

Another object is to provide an improved structure in a filament for a lamp or the like.

Another object is to provide new and improved structures in spark plug electrodes which permit same to operate over longer periods of time with less pitting and erosion caused by high temperatures and electrical discharges therebetween.

Another object is to provide improved structures in electrodes and lamp filaments which are coated with thin films of synthetic diamond material operable to protect the base metal and wherein further coating of chromium or other metal is applied over the diamond film to protect same during use.

Another object is to provide improvements in electrodes lamp filaments and the like which are partly coated with synthetic diamond material for protecting same against corrosion and erosion during use, wherein a select portion or portions thereof are void of such coating to control the nature and/or location of the discharge.

With the above and such other objects in view as may hereinafter more fully appear, the invention consists of the novel structures, article constructions and methods described in the following specification and illustrated in the accompanying drawings, but it is to be understood that variations and modifications may be resorted to which fall within the scope of the invention as claimed without departing from the nature and spirit of the invention.

BRIEF DESCRIPTION OF THE DRAWINGS

In FIG. 1 is shown an improved assembly defining an electrode device 10, such as a spark plug for use in internal combustion engines, burners and the like. Similar constructional details or modifications of those shown in FIG. 1 may be employed in the fabrication of other electrode containing devices having one or more electrodes which are subject to high temperature, chemical and electrical corrosion caused by plasma and spark discharge and, in certain instances, by resulting chemical action, such as combustion adjacent thereto.

Figure 1:
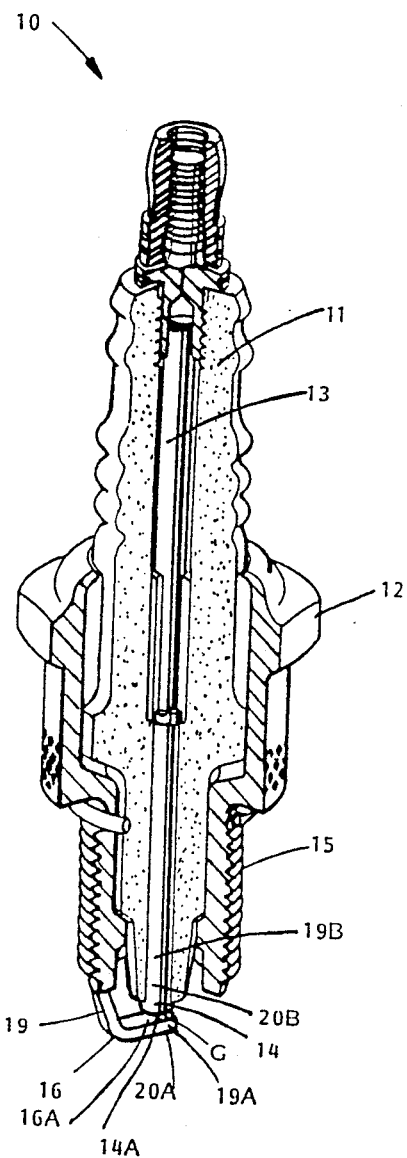
FIG. 1 is an isometric view with parts broken away and sectioned for clarity of a spark plug having features of the instant invention and FIG. 2 is a fragmentary view in cross section of a portion of composite material of the type employed in FIG. 1 or in other articles of manufacture such as described in the specification.

The spark plug 10 is assembled with an insulator portion 11 and a metal shell portion 12 surrounding the insulator portion at one end thereof. A rod-like metal terminal 13 extends longitudinally through the insulator portion and is secured at its end to or defines the center electrode of the spark plug.

The lower threaded portion 15 of the shell 12 has a side electrode 16 welded thereto and extending across the end 14 of the center electrode 13 defining a gap therebetween, across which gap high voltage electrical energy is discharged during operation, to generate plasmas or sparks. Notation 19 refers to a synthetic diamond or diamond-like coating applied to either or both the side electrode 16 and the center electrode 13 or just the end portions 14 and 17 thereof across which a spark or electrical discharge is effected during the operation of the spark plug or electrode assembly.

In a particular form of the invention, substantially all surface areas of the center electrode 13 and the side electrode 16 or just the exposed portions thereof are so coated with synthetic diamond-like material to the exclusion of respective small portions of the exposed areas thereof defining the gap G therebetween. The gap may thus have opposing wall portions formed of the metals of the center and side electrodes while plated with high temperature resistent material, such as chromium or chromium alloys. The remaining portions of the electrodes which are coated with such synthetic diamond material are thus protected against heat, electrical and/or chemical erosion during use.

Notation 20 refers to an overcoating of a protective material, such as chromium or chromium alloy, deposited against those portions of the electrodes containing synthetic diamond coatings and, in certain instances, across one or more portions of each of the electrodes which are void of such synthetic diamond coating material.

In a modified form of spark plug a select portion of the surface of the center electrode and or the side electrode which face each other across the gap are void of the synthetic diamond material or contain same in a thickness such that the discharge of a spark or arc therebetween may be operatively effected during engine operation without misfiring. Depending on voltage applied, synthetic diamond film thickness at the gap location may vary from between 0.00001" to 0.001" and may either be of constant thickness or may increase along other portions of the electrodes. Such thin film containing portions or areas void of diamond material may comprise the end face of the center electrode 13 and/or an equal area of the side electrode 16 face the end of the center electrode. To increase the number of arcs or sparks generated, such diamond coating may be applied to either or both electrodes as a series of space separated narrow bands of thickness such that a plurality of spark or arc discharges will occur therebetween each time high voltage is applied to the center electrode. While notations 19 and 20 refer generally to the respective synthetic diamond coating and chromium overcoating, notations 19A and 20A define such material covering the surfaces of the side electrode 16 while 19B and 20B to such materials covering the surfaces of the center electrode 13.

Figure 2:
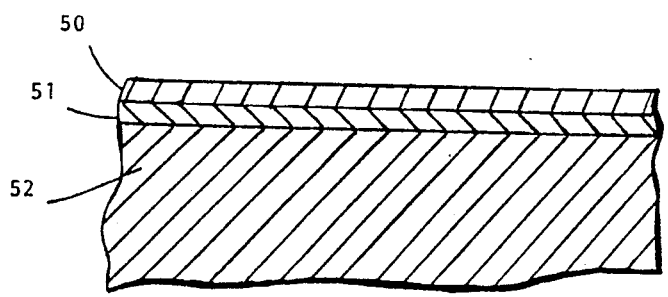

In FIG. 2 is shown structural details of the synthetic diamond coatings, the protective overcoatings and the substrates coated. The substrate, which may be any of the configurations hereinabove described, is denoted 52 and is made of suitable metal, metal alloy, cermet or ceramic material or combinations thereof fabricated by casting, molding, extrusion, machining, forging or one or more of such processes. The synthetic diamond coating 51 may be deposited as carbon atoms stripped from molecules of such gas as methane or other hydrocarbon, vaporous hydrocarbon or carbon atom containing material, combinations of gas and vapor carbon atom containing materials, preferably with suitable hydrogen gas mixed therewith to provide suitably efficient deposition and synthetic diamond layer formation to the desired thickness which may vary in the range of 0.000001" to 0.010" and, for most applications in the range of a few millions of an inch to a few thousandths of an inch. The overcoating 50 of chromium is shown completely covering the synthetic diamond coating 51 and may be applied by electroless or electrical deposition, vapor deposition, detonation or plasma plating. Thickness of depths of such overcoating may range from 0.0001 to several thousands of an inch or more and preferably in the range of a few thousands of an inch or less.

The substrate 52 of FIG. 2 may also be made of a number of materials other than metal, metal alloys or ceramic material as described. For certain applications involving the structures described it may be made of mixtures of ceramic or metal powder or a combination of both per se of mixed with short synthetic diamond filaments or particles shaped, dimensioned and produced as set forth in my copending patent application Ser. No. 032,352 filed Mar. 31, 1987, now U.S. Pat. No. 4,960,643, providing a rigid matrix which is reinforced by such particles and, in certain applications, tailored in chemical and electrical characteristics to perform select functions as a high strength insulating, semiconducting or conducting material or as a heat conducting or insulating material, the surface or surfaces of which are protected from corrosion, erosion and frictional wear and failure due to forces applied thereto during operational use by either or both the coatings 50 and 51.

What is claimed is:

1. An electrode for use with an electrical device which includes means for electrically energizing said electrode and raising the temperature of the material of said electrode, comprising:
   (a) a substrate formed of electrically conducting metal and having a portion thereof operable to discharge energy to space adjacent said electrode when said substrate is energized with sufficient electrical energy to effect such discharge; and
   (b) synthetic diamond material coating at least that portion of said substrate from which said energy is discharged during the operation of said electrical device.

2. An electrode in accordance with claim 1 wherein the entire outer surface of said substrate is coated with said synthetic diamond material.

3. An electrode in accordance with claim 1 including a base portion for supporting said substrate in assembly with an electrical device.

4. An electrode in accordance with claim 1 wherein said substrate defines a filament of a high voltage discharge electrical device.

5. An electrode in accordance with claim 1 formed of a plurality of substrates assembled together, each of which substrate is coated with a synthetic diamond material.

6. An electrode in accordance with claim 5 including an outer layer deposited in situ against said synthetic diamond material for protecting same against heat corrosion and particle erosion.

7. An electrode in accordance with claim 1 having a thin coating of conductive metal deposited on the outer surface of said synthetic diamond material.

8. An electrode in accordance with claim 7 wherein said synthetic diamond material is formed in situ on said substrate by the deposition of carbon atoms from molecules of a hydorcarbon fluid disposed adjacent said substrate to a thickness less than 0.001".

9. An electrode in accordance with claim 1 forming one of the electrodes of a spark plug.

10. An electrode in accordance with claim 1 having a portion of its surface void of synthetic diamond material.

11. A spark plug for use in internal combustion engines comprising:
   a) a spark plug body defined by a tubular metal shell one end of which is threaded for turning assembly in a threaded recepticle of an internal combustion engine,
   b) an elongated center electrode,
   c) an insulator surrounding said center electrode and supporting same centrally in said tubular metal shell,
   d) a side electrode secured to one end of said shell,
   e) an end of said side electrode extending aligned with an end of said center electrode defining a gap across which a spark may be generated,
   f) portions of said center electrode and said side electrode exposed to the hot gases and pressures of combustion when the internal combustion engine employing said spark plug for ignition is operating being coated with synthetic diamond material operable to protect same against heat and chemical corrosion.

12. A spark plug in accordance with claim 11 having portions of said center electrode and said side electrode which are aligned with said gap being void of said synthetic diamond material.

13. A spark plug in accordance with claim 12 including a conducting metal coating said portions of said side and center electrodes which are void of said synthetic diamond material.

* * * * *